United States Patent [19]
Merchant et al.

[11] Patent Number: 5,599,739
[45] Date of Patent: Feb. 4, 1997

[54] BARRIER LAYER TREATMENTS FOR TUNGSTEN PLUG

[75] Inventors: Sailesh M. Merchant, Orlando, Fla.; Arun K. Nanda, Austin; Pradip K. Roy, Orlando, both of Tex.

[73] Assignee: Lucent Technologies Inc., Murray Hill, N.J.

[21] Appl. No.: 366,867

[22] Filed: Dec. 30, 1994

[51] Int. Cl.$^6$ .................................................. H01L 21/443
[52] U.S. Cl. ........................... 437/190; 437/192; 437/246
[58] Field of Search ..................................... 437/192, 246, 437/190

[56] References Cited

U.S. PATENT DOCUMENTS

| | | |
|---|---|---|
| 4,532,702 | 8/1985 | Gigante et al. . |
| 4,782,380 | 11/1988 | Shankar et al. ............................ 357/71 |
| 4,804,560 | 2/1989 | Shioya et al. . |
| 5,143,861 | 9/1992 | Turner . |
| 5,164,330 | 11/1992 | Davis et al. . |
| 5,164,333 | 11/1992 | Schwalke et al. ...................... 437/200 |
| 5,175,126 | 12/1992 | Ho et al. .................................. 437/190 |
| 5,183,782 | 2/1993 | Onishi et al. . |
| 5,200,360 | 4/1993 | Bradbury et al. . |
| 5,202,579 | 4/1993 | Fujii et al. . |
| 5,232,871 | 8/1993 | Ho ............................................ 437/190 |
| 5,232,873 | 8/1993 | Geva et al. . |
| 5,233,223 | 8/1993 | Murayama . |
| 5,244,534 | 9/1993 | Yu et al. . |
| 5,260,232 | 11/1993 | Muroyama et al. . |
| 5,312,775 | 5/1994 | Fujii et al. . |
| 5,327,011 | 7/1994 | Iwamatsu . |
| 5,332,691 | 7/1994 | Kinoshita et al. ....................... 437/192 |
| 5,397,742 | 3/1995 | Kim ......................................... 437/190 |
| 5,407,698 | 4/1995 | Emesh . |

FOREIGN PATENT DOCUMENTS

| | | |
|---|---|---|
| 5152292 | 6/1993 | Japan . |
| 5-347272 | 12/1993 | Japan ............................ H01L 21/28 |
| 5-326517 | 12/1993 | Japan ........................ H01L 21/3205 |
| 6-275624 | 9/1994 | Japan ........................ H01L 21/3205 |

*Primary Examiner*—Robert Kunemund
*Assistant Examiner*—Matthew Whipple

[57] ABSTRACT

Tungsten plugs are formed by passivating a substrate having a contact hole with $SiH_4$, forming a nucleation layer on the passivated substrate by reducing $WF_6$ with $SiH_4$ at relatively low pressures and depositing tungsten to substantially fill the contact hole by reducing $WF_6$ with $H_2$ at relatively high pressures. Alternatively, rapid thermal annealing is used to cure pinhole defects in a titanium nitride layer on a substrate to avoid the formation of unwanted tungsten volcanoes.

34 Claims, 4 Drawing Sheets

5,599,739

BARRIER LAYER TREATMENTS FOR TUNGSTEN PLUG

BACKGROUND

1. Technical Field

This disclosure relates generally to the manufacture of semiconductor devices having a multilayer interconnection structure. More specifically, this disclosure relates to novel methods of making tungsten plugs in such devices.

2. Background of Related Art

In the manufacture of a conventional tungsten plug or stud, a substrate 101 has a contact hole 110 formed therein as shown in FIG. 1A. A titanium layer 112 and a titanium nitride layer 114 are sequentially deposited on the substrate. Near the top edge 115 of contact hole 110, layers 112 and 114 are normally quite thin. Tungsten is then deposited, for example via chemical vapor deposition, to fill contact hole 110. Depending on the position of the substrate within the device, the structure shown in FIG. 1A can be used to produce a tungsten plug at the window level or a tungsten plug at the via level.

Tungsten deposition by CVD involves the use of tungsten hexafluoride, and subjects the coated substrate to fluorine and hydrofluoric acid. Diffusion of fluorine gas through pinhole defects in titanium nitride layer 114 causes excessive tungsten growth at the location of the defect.

Specifically, as shown in FIG. 1B, rupture in titanium nitride layer 114 may occur, particularly at the top edge 115 of contact hole 110. Where such ruptures occur, volcanoes 125 are formed which are areas of thick tungsten growth compared to tungsten layer produced within the contact hole 110 and the portion 122 of the tungsten layer produced on the surface of the substrate 101. Hole 110 may not be completely filled with tungsten if growth is sufficiently rapid to cover the opening of the contact hole and thereby partially or completely block any further tungsten deposition within the hole. However, even where the contact hole is completely filled by a tungsten plug 130, a large tungsten growth 126 is formed, the thickness of which far exceeds the thickness of the portion 122 of the tungsten layer on the surface of substrate 101, as shown in FIG. 1C. Ultimately, the device may have to be discarded due to the presence of the volcanoes. Where it is possible to salvage the device, additional steps must be taken to remove growth 126 from the surface of the device, adding to the cost of producing the device.

It would be desirable to provide a tungsten plug by a method which does not produce volcanoes or undesired tungsten growths on the surface of the device.

SUMMARY

Novel techniques for forming tungsten plugs are disclosed herein which avoid the formation of volcanoes and unwanted, excessive tungsten growths on the surface of the substrate.

In one aspect, it has been discovered that by carefully controlling the chemistry during chemical vapor deposition of tungsten, the integrity of the titanium nitride layer is preserved and the formation of volcanoes is avoided. Specifically, tungsten plugs are formed at the window or via level in accordance with one aspect of this disclosure by passivating a substrate having a contact hole formed therein by contacting the substrate with silane gas. A nucleation or seed layer of $WSi_x$ is then applied to the passivated substrate by reducing tungsten hexafluoride with silane. In particularly useful embodiments, the ratio of silane to tungsten hexafluoride is in the ratio of 4:1 to 6:1 and pressures of 1 Torr or less are used during formation of the nucleation or seed layer. Tungsten is then deposited to at least substantially fill the contact hole. In a particularly useful embodiment, tungsten is deposited by reducing tungsten hexafluoride with hydrogen gas using pressures of 20 Torr or greater.

In another aspect, it has been discovered that tungsten plugs can be formed at the via level without the growth of volcanoes by subjecting a substrate coated with a titanium layer and then a titanium nitride layer to rapid thermal annealing to cure pinhole defects in the titanium and titanium nitride layers prior to passivation, nucleation and deposition steps.

BRIEF DESCRIPTION OF THE DRAWINGS

Various embodiments are described herein with reference to the drawings, wherein.

DETAILED DESCRIPTION OF PREFERRED EMBODIMENTS

Two different novel via filling processes are disclosed herein. One method includes the formation of a $WSi_x$ nucleation layer on a substrate prior to tungsten deposition. The other method involves rapid thermal annealing of a titanium nitride layer on a substrate prior to tungsten deposition. The deposition of a $WSi_x$ nucleation layer and rapid thermal annealing of the titanium nitride layer are steps in two separate via filling processes which can be successfully used to prevent volcano formation. It should be understood that the two process steps can, if desired, be used together in a single via filling process.

Figure 1A:
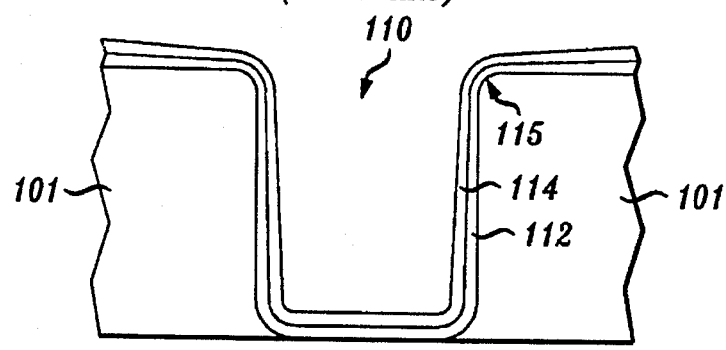
FIGS. 1A–1C are schematic representations of structures at various stages during the formulation of tungsten plugs (either at the window level or at the via level) using conventional, prior art techniques.
Figure 1B:
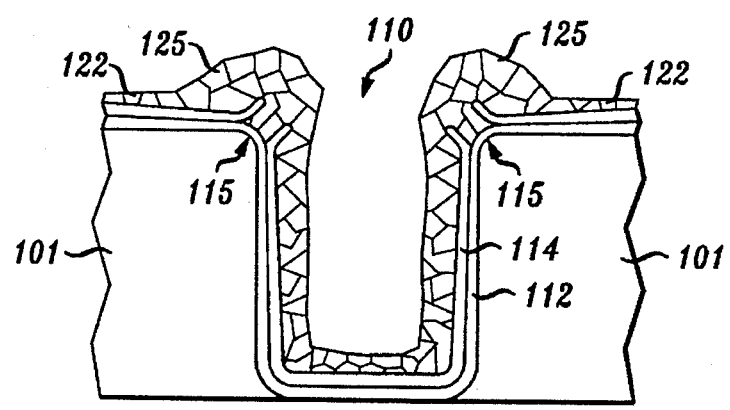
Figure 1C:
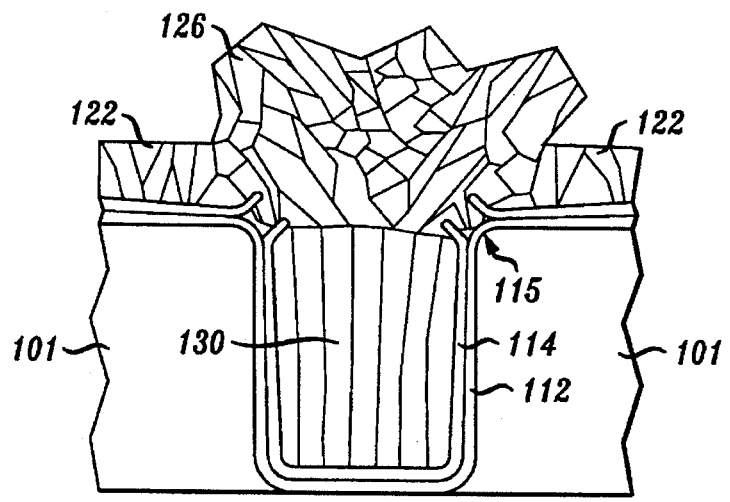
Figure 2:
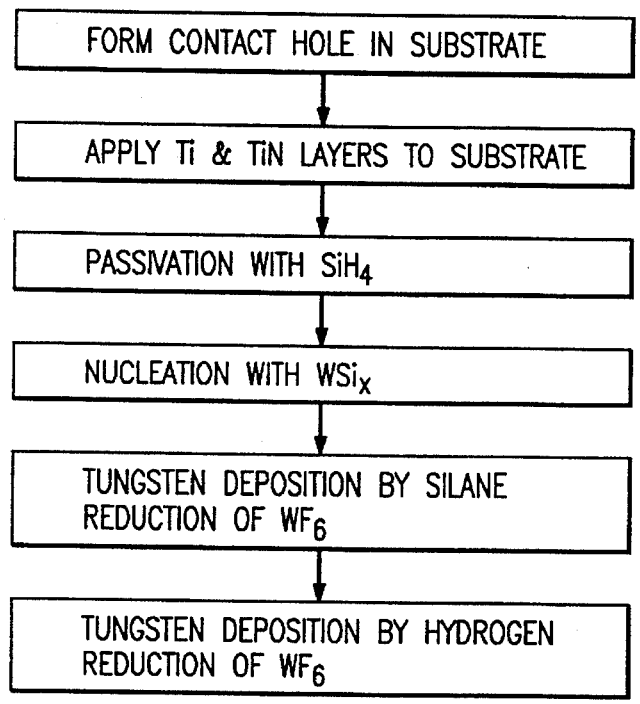
FIG. 2 is a flow diagram showing the steps for forming a tungsten plug (at the window or via level) in accordance with a method disclosed herein.

FIG. 2 is a flow diagram summarizing the steps in one method of forming a tungsten plug in accordance with this disclosure. First, a contact hole is formed in the insulator layer of a substrate to expose a portion of a conductive layer or active layer of the device on which the insulator layer has been deposited. Next, titanium and titanium nitride layers are applied to the substrate. The coated substrate is then optionally subjected to rapid thermal annealing. Next, the coated substrate is passivated by contact with $SiH_4$. Then a nucleation or seed layer of $WSi_x$ is applied by silane reduction of tungsten hexafluoride at a relatively low pressure, followed by tungsten deposition by silane reduction of tungsten hexafluoride. Finally, the contact hole is at least substantially filled with tungsten by hydrogen reduction of tungsten hexafluoride at relatively high pressures.

Figure 3:
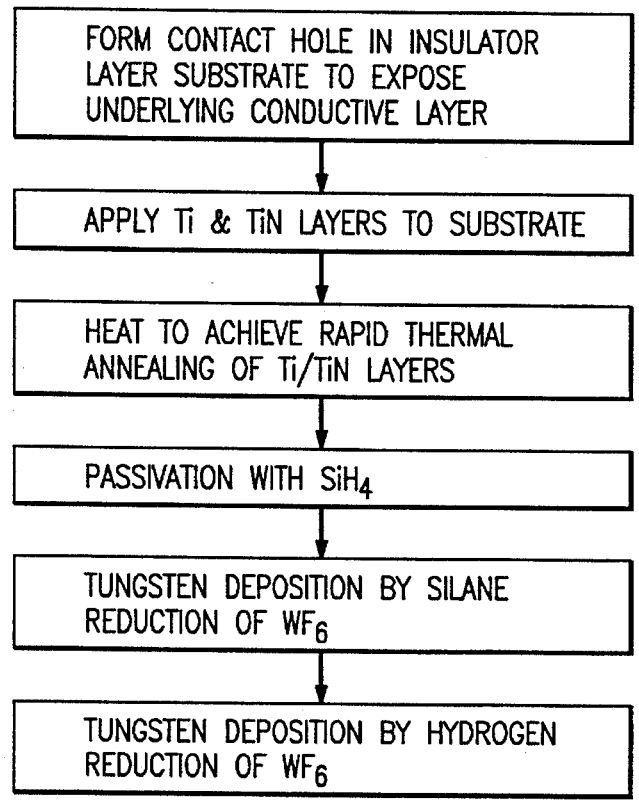
FIG. 3 is a flow diagram showing the steps for forming a tungsten plug at the via level in accordance with another method disclosed herein.

The steps of another method in accordance with this disclosure, is shown in the flow diagram of FIG. 3. The method of FIG. 3 is particularly useful in forming a tungsten plug at the via level and does not include the step of depositing a $WSi_x$ nucleation layer. Rather, the method represented in FIG. 3 includes the step of thermal annealing to cure pinhole defects in the titanium nitride layer. The conditions for performing the various steps set forth in FIGS. 2 and 3 are set forth below and will be explained by reference to FIGS. 4A–D.

Figure 4A:
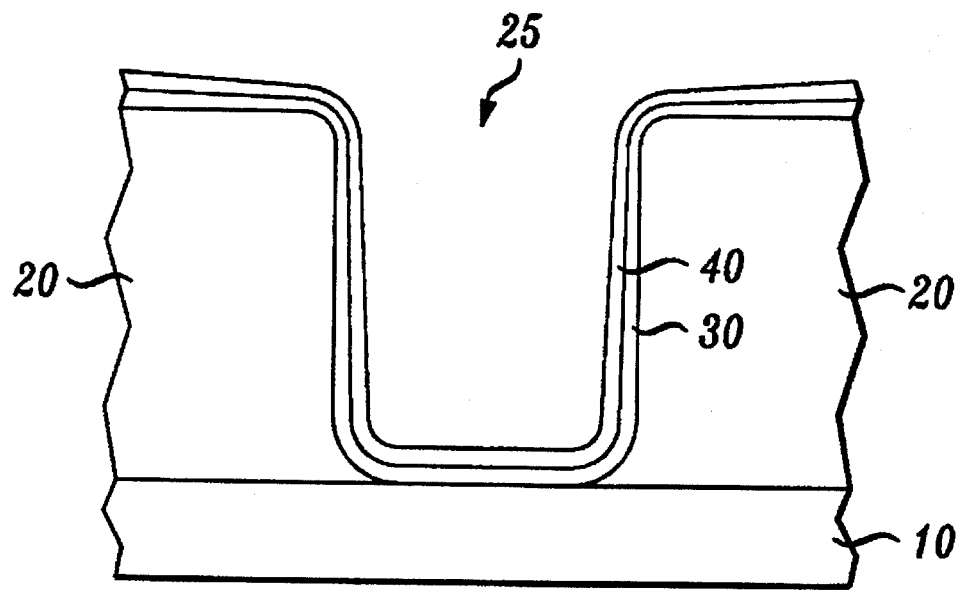
FIGS. 4A–4D are schematic representations of structures at various stages during the formulation of a tungsten plug in accordance with the methods of this disclosure.

Referring to FIG. 4A, a substrate useful in forming a layered semiconductor device is shown wherein a first conductive layer 10 has an insulator layer 20 formed thereon. Insulator layer 20 can be made from any typical and well-known dielectric material used in wafer fabrication, but is preferably $PETEOS.SiO_2$.

A contact hole 25 extending down to the first conductive layer 10 is formed in insulator layer 20 using known photolithographic techniques. Since the contact hole extends down to a conductive layer, it will be appreciated by those skilled in the art that the structure shown in FIGS. 4A–D is used to form a tungsten plug at the via level. It should be understood, however, that tungsten plugs can also be formed at the window level using the methods disclosed herein. Preferably, the method shown in FIG. 3 is used to form tungsten plugs at the via level.

A titanium film 30 is deposited on the exposed surfaces. Titanium film 30 can be applied, for example, using a vacuum deposition technique, e.g., sputtering (with or without collimation). The thickness of titanium film can be in the range of about 50 Å to about 750 Å, preferably 500–600 Å.

A titanium nitride (TiN) film 40 is then deposited on all exposed surfaces of titanium film 30. Titanium nitride film 40 can be formed using any known technique such as a reactive sputtering process (with or without collimation) wherein sputtering is carried out in $Ar+N_2$ atmosphere using a Ti target. The thickness of titanium nitride film 40 can be in the range of about 50 Å to about 1500 Å, preferably from 600 Å to about 1200 Å. TiN film 40 serves as an adhesion layer, facilitating deposition of tungsten onto the substrate.

Prior to beginning the tungsten deposition process, rapid thermal annealing (RTA) of the titanium/titanium nitride coated substrate can be carried out. RTA can be accomplished by exposing the coated substrate to temperatures of 450° to 550° C. for a period of time ranging from 5 to 60 seconds. The particular time and temperature employed will vary based on a number of factors including the thickness of the titanium and titanium nitride layers. In a particularly useful embodiment, substrates containing titanium nitride layers less than 600 Å thick can be annealed at 550° C. for 20 seconds. While not wishing to be bound to any theory, it is believed that RTA tends to cure pinhole defects in the titanium nitride layer, thereby reducing the likelihood of volcano growth during tungsten deposition. For the process shown in FIG. 2, annealing is an optional step.

Figure 4B:
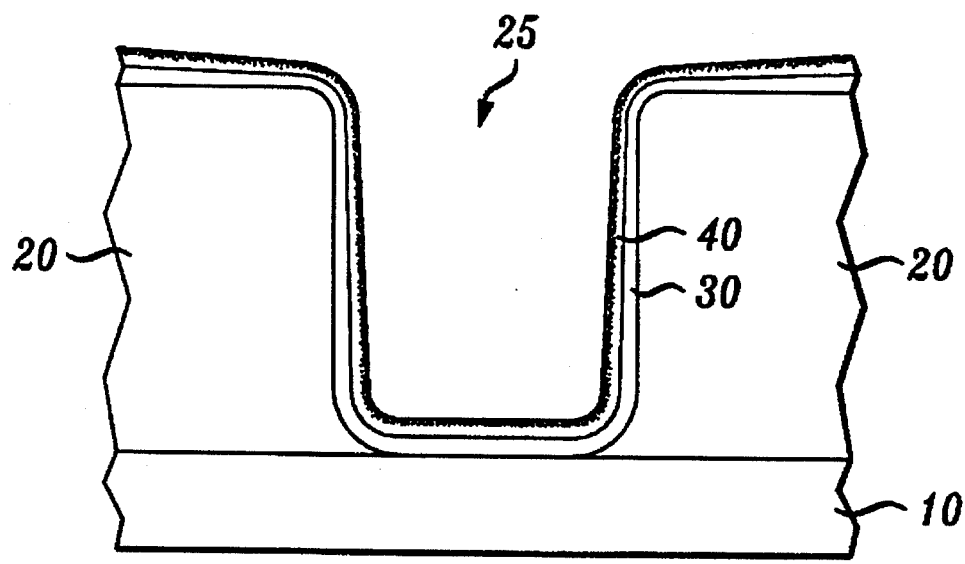

The TiN surface is then passivated by bringing silane ($SiH_4$) gas into contact with the TiN surface. Specifically, the Ti/TiN coated substrate is placed within a vacuum chamber and silane is introduced into the chamber at a flow rate ranging from 75 to 300 standard cubic centimeters per minute ("SCCM") for anywhere from 25 to 150 seconds. Preferably, the passivation process produces a discontinuous monolayer of silicon on the titanium nitride layer. The passivated, coated substrate is shown in FIG. 4B.

Figure 4C:
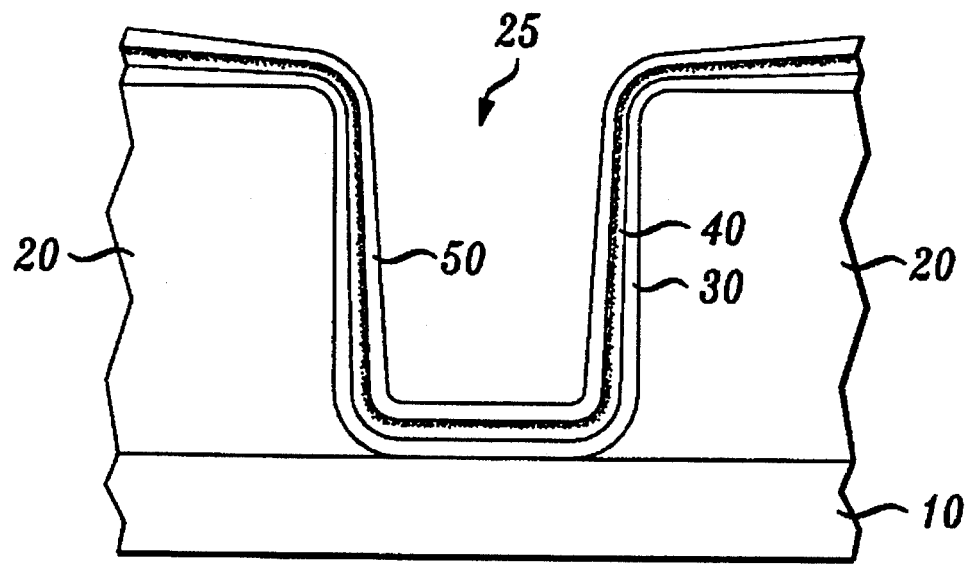

After passivation, a nucleation layer is formed by performing $WF_6$ reduction by $SiH_4$ at relatively low pressures. During the nucleation step, the flow of silane into the chamber is in the range of 75 to 300 SCCM and the flow of $WF_6$ into the chamber is in the range 35 to 300 SCCM. Preferably, the ratio of $SiH_4:WF_6$ flow rates is from about 6:1 to 4:1. Hydrogen ($H_2$) gas is also introduced into the chamber during nucleation at a rate of from 1000 to 6000 SCCM, preferably from 1500 to 3000 SCCM. The duration of the nucleation step is from 10 to 150 seconds at pressure ranging from 0.1 to 1.0 Torr. The temperature is during nucleation should be maintained between about 400°–450° C., preferably 420°–430° C. The nucleation step is believed to provide a $WSi_x$ seed layer 50 on the passivated TiN surface (See FIG. 4C). While seed layer 50 is shown in FIG. 4C as a continuous layer, it should be understood that seed layer 50 can be a discontinuous layer applied to the TiN adhesion layer 40. Preferably, the thickness of seed layer 50 is up to 30 Å, more preferably 2.5 Å to 25 Å. In the process of FIG. 3, the step of forming a $WSi_x$ nucleation layer need not be performed.

Simply by adjusting the relative flow rates of $SiH_4$ and $WF_6$, tungsten deposition can be initiated. The conditions suitable for tungsten deposition by silane reduction of tungsten hexafluoride are known to those skilled in the art.

Rapid deposition of tungsten is then achieved by $WF_6$ reduction with $H_2$ at a relatively high total pressure. To achieve tungsten deposition, $H_2$ is introduced into the chamber at flow rates of from 6000 to 7500 SCCM, preferably 6500 to 7000 SCCM, and $WF_6$ is introduced into the chamber at flow rates of 300 to 500 SCCM, preferably, about 400 SCCM. The total pressure during this deposition step is in the range 10 Torr to 100 Torr, preferably 20–50 Torr, most preferably 25–35 Torr.

Figure 4D:
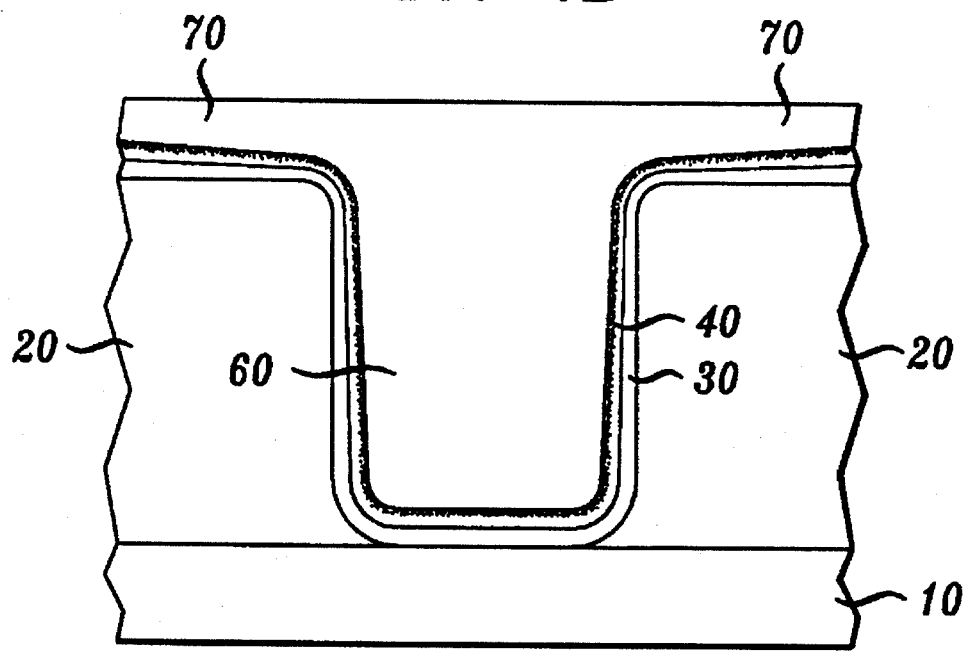

Tungsten deposition is continued for a period of time sufficient to substantially fill the contact hole. In particularly useful embodiments, the tungsten deposition is continued until the contact hole is completely filled with a tungsten plug 60 and a substantially even layer 70 of tungsten is deposited on the upper surface of the structure as shown in FIG. 4D. Upon deposition of tungsten plug 60, seed layer 50 may no longer be noticeable. While not wishing to be bound to any theory, it is believed that the $WSi_x$ seed layer is converted to metallic tungsten during the $H_2$ reduction.

It will be understood that various modifications may be made to the embodiments disclosed herein. For example, while this disclosure has been presented in terms of a portion of a specific structure, it will be appreciated that the methods disclosed herein can be practiced on any type of device where it is necessary to make electrical contact to regions or layers under one or more insulator layers. Therefore, the above description should not be construed as limiting, but merely as exemplifications of preferred embodiments. Those skilled in the art will envision other modifications within the scope and spirit of the claims appended hereto.

What is claimed is:

1. A method of forming a tungsten plug comprising:

providing a substrate having a contact hole formed therein;

applying an adhesion layer of titanium nitride to at least a portion of the substrate;

contacting the substrate with $SiH_4$ to passivate the titanium nitride surface of the substrate;

reducing $WF_6$ with $SiH_4$ at a pressure of 1 Torr or less in the presence of the passivated substrate to form a nucleation layer on the passivated substrate; and reducing $WF_6$ with $H_2$ at a pressure of at least 10 Torr to deposit tungsten to at least substantially fill the contact hole.

2. A method as in claim 1, wherein the layer of titanium nitride is at least about 600 Å thick.

3. A method as in claim 1, wherein the step of reducing WF$_6$ with SiH$_4$ is conducted at a pressure less than about 0.5 Torr.

4. A method as in claim 1, wherein the step of reducing WF$_6$ with H$_2$ is conducted at a pressure of at least about 10 Torr.

5. A method as in claim 1, wherein the step of reducing WF$_6$ with H$_2$ is conducted at a pressure of at least 25 Torr.

6. A method as in claim 1, wherein the steps of reducing WF$_6$ with SiH$_4$ and reducing WF$_6$ with H$_2$ are both conducted at temperatures greater than about 400° C.

7. A method as in claim 1, further comprising the step of annealing the adhesion layer prior to passivation.

8. A method as in claim 7, wherein the annealing is conducted at a temperature ranging from 450° C. to 550° C. for a time ranging from 5 seconds to about 60 seconds.

9. A method of forming a tungsten plug comprising:
   placing a substrate within a chamber, the substrate comprising a conductive layer, an insulator layer formed on the conductive layer, the insulator layer having a contact hole formed therein, the contact hole extending through the insulator layer and exposing a portion of the conductive layer;
   applying an adhesion layer Of titanium nitride to at least a portion of the substrate;
   introducing SiH$_4$ gas into the chamber to passivate the titanium nitride layer of the substrate;
   introducing SiH$_4$ gas and WF$_6$ gas into the chamber, whereby WF$_6$ is reduced thereby nucleating the passivated substrate;
   depositing tungsten to at least substantially fill the contact hole.

10. A method as in claim 9, wherein the layer of titanium nitride is at least about 600 Å thick.

11. A method as in claim 9, further comprising the step of annealing the adhesion layer prior to the step of introducing SiH$_4$ gas into the chamber.

12. A method as in claim 11, wherein the annealing step comprises heating the coated substrate to a temperature between about 450° C. and about 550° C. for a period of time from about 5 seconds to about 60 seconds.

13. A method as in claim 9, wherein the step of introducing SiH$_4$ and WF$_6$ gas into the chamber comprises introducing SiH$_4$ into the chamber at a flow rate of about 75 SCCM to about 300 SCCM and introducing WF$_6$ into the chamber at a flow rate of about 35 SCCM to about 300 SCCM.

14. A method as in claim 9, wherein the step of introducing SiH$_4$ gas and WF$_6$ gas comprises introducing SiH$_4$ gas and WF$_6$ gas in a ratio of about 4:1 to about 6:1.

15. A method as in claim 9, wherein the pressure within the chamber during the step of introducing SiH$_4$ and WF$_6$ does not exceed about 1 Torr.

16. A method as in claim 9, wherein the pressure within the chamber during the step of introducing H$_2$ gas and WF$_6$ gas is at least about 20 Torr.

17. A method of forming a tungsten plug comprising:
   providing a coated substrate, the coated substrate comprising a conductive layer, an insulator layer formed on the conductive layer, a contact hole formed through the insulator layer to expose a portion of the conductive layer, a layer of titanium coating at least a portion of the insulator layer and the exposed portion of the conductive layer and a layer of titanium nitride applied to the titanium layer;
   passivating the coated substrate by contacting the layer of titanium nitride with silane;
   depositing a nucleation layer on the passivated, coated substrate by reducing tungsten hexafluoride with silane at a pressure of about 1 Torr or less in the presence of the passivated, coated substrate, the ratio of silane to tungsten hexafluoride being in the range of 4:1 to 6:1 during the deposition of the nucleation layer; and
   depositing tungsten to at least substantially fill the contact hole by reducing tungsten hexafluoride with hydrogen gas a pressure of at least about 20 Torr.

18. A method as in claim 17, wherein the layer of titanium nitride is at least about 600 Å thick.

19. A method as in claim 17, wherein the step of reducing WF$_6$ with SiH$_4$ is conducted at a pressure less than about 0.5 Torr.

20. A method as in claim 17, wherein the step of reducing WF$_6$ with H$_2$ is conducted at a pressure of at least about 10 Torr.

21. A method as in claim 17, wherein the step of reducing WF$_6$ with H$_2$ is conducted at a pressure of at least 25 Torr.

22. A method as in claim 17, wherein the steps of reducing WF$_6$ with SiH$_4$ and reducing WF$_6$ with H$_2$ are both conducted at temperatures greater than about 400° C.

23. A method as in claim 17, further comprising the step of annealing the layer of titanium nitride prior to passivation.

24. A method as in claim 23, wherein the annealing is conducted at a temperature ranging from 450° C. to 550° C. for a time ranging from 5 seconds to about 60 seconds.

25. A method as in claim 17, wherein the layer of titanium nitride is applied to the substrate by a reactive sputtering process with collimation.

26. A method as in claim 17, wherein the layer of titanium nitride is applied to the substrate by a reactive sputtering process without collimating.

27. A method of forming a tungsten plug at the via level comprising:
   providing a coated substrate, the coated substrate comprising a conductive layer, an insulator layer formed on the conductive layer, a contact hole formed through the insulator layer to expose a portion of the conductive layer, a layer of titanium coating at least a portion of the insulator layer and the exposed portion of the conductive layer and a layer of titanium nitride applied to the titanium layer;
   heating the coated substrate to achieve rapid thermal annealing of the layers of titanium and titanium nitride by exposing the substrate to a temperature in the range of 450° to 550° C. for a period of time between 5 and 60 seconds; and
   depositing tungsten to at least substantially fill the contact hole.

28. A method as in claim 27, further comprising the step of passivating the coated substrate by contacting the annealed layer of titanium nitride with silane.

29. A method as in claim 28, further comprising the step of depositing a nucleation layer on the passivated, coated substrate by reducing tungsten hexafluoride with silane.

30. A method as in claim 27, wherein the step of depositing tungsten comprises reducing tungsten hexafluoride with hydrogen gas.

31. A method of forming a tungsten plug at the via level comprising:
   providing a coated substrate, the coated substrate comprising a conductive layer, an insulator layer formed on the conductive layer, a contact hole formed through the insulator layer to expose a portion of the conductive layer, a layer of titanium coating at least a portion of the insulator layer and the exposed portion of the conductive layer and a layer of titanium nitride applied to the titanium layer;

heating the coated substrate to achieve rapid thermal annealing of the layers of titanium and titanium nitride;

passivating the coated substrate by contacting the annealed layer of titanium nitride with silane;

depositing a nucleation layer on the passivated, coated substrate by reducing tungsten hexafluoride with silane; and depositing tungsten to at least substantially fill the contact hole.

32. A method as in claim 31, wherein the step of heating comprises exposing the substrate to a temperature in the range of 450° to 50° C. for a period of time between 5 and 60 seconds.

33. A method as in claim 31, wherein the step of depositing tungsten comprises reducing tungsten hexafluoride with hydrogen gas.

34. A method of forming a tungsten plug comprising:

providing a substrate having a contact hole formed therein;

applying an adhesion layer of titanium nitride to at least a portion of the substrate prior to passivation;

contacting the substrate with $SiH_4$ to passivate the titanium nitride surface of the substrate;

reducing $WF_6$ with $SiH_4$ in the presence of the passivated substrate to form a nucleation layer on at least the passivated titanium nitride surface of the substrate; and depositing tungsten to at least substantially fill the contact hole.

* * * * *